(12) United States Patent
Sugiya

(10) Patent No.: US 10,366,925 B2
(45) Date of Patent: Jul. 30, 2019

(54) WAFER PROCESSING METHOD

(71) Applicant: DISCO CORPORATION, Tokyo (JP)

(72) Inventor: Tetsukazu Sugiya, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 16/037,238

(22) Filed: Jul. 17, 2018

(65) Prior Publication Data

US 2019/0027408 A1 Jan. 24, 2019

(30) Foreign Application Priority Data

Jul. 24, 2017 (JP) .................................. 2017-142630

(51) Int. Cl.
H01L 21/78 (2006.01)
H01L 21/304 (2006.01)

(52) U.S. Cl.
CPC ............ H01L 21/78 (2013.01); H01L 21/304 (2013.01)

(58) Field of Classification Search
CPC ............................. H01L 21/78; H01L 21/304
USPC .......................................................... 438/462
See application file for complete search history.

(56) References Cited

U.S. PATENT DOCUMENTS

| 7,736,944 | B2* | 6/2010 | Shizuno | H01L 23/3114 438/106 |
| 2003/0094621 | A1* | 5/2003 | Teramae | H01L 23/3185 257/99 |
| 2005/0184037 | A1* | 8/2005 | Fukuyo | B23K 26/03 219/121.72 |
| 2017/0301549 | A1* | 10/2017 | Suzuki | B23K 26/402 |
| 2018/0350707 | A1* | 12/2018 | Kishida | H01L 23/28 |

FOREIGN PATENT DOCUMENTS

| JP | 2002192370 A | 7/2002 |
| JP | 2007027250 A | 2/2007 |
| JP | 2016207936 A | 12/2016 |

* cited by examiner

Primary Examiner — Igwe U Anya
(74) Attorney, Agent, or Firm — Greer Burns & Crain, Ltd.

(57) ABSTRACT

A method of processing a wafer includes a laser beam applying step of applying a laser beam to the wafer to form modified layers in the inside of the wafer along division lines and to extend device layer splitting cracks from the modified layers to the front surface of the wafer. After the laser beam applying step is performed, a cutting step of cutting the wafer is performed by a cutting blade from the back surface side to form cut grooves and to remove the modified layers. Therefore, the modified layers are not left on chips, and the die strength of the chips is enhanced.

2 Claims, 5 Drawing Sheets

WAFER PROCESSING METHOD

BACKGROUND OF THE INVENTION

Field of the Invention

The present invention relates to a method of processing a wafer that has a substrate and a device layer formed with devices in respective regions partitioned by a plurality of division lines (streets) intersecting on a front surface of the substrate.

Description of the Related Art

As a method for dividing a wafer into individual chips, there is, for example, a method in which a laser beam is applied to the inside of the wafer along division lines to form modified layers in the inside of the wafer, and then an external force is applied along the division lines to divide the wafer, with the modified layers as division starting points (see, for example, Japanese Patent No. 3408805). As an apparatus for applying an external force to the wafer, there is an expanding apparatus that can expand in plane directions a wafer supported by an annular frame through an expandable tape (see, for example, Japanese Patent Laid-open No. 2007-27250). When dividing the wafer by such an expanding apparatus, the expandable tape is adhered to the back surface of the wafer through an adhesive film called die attach film (DAF), for example, and the expandable tape is expanded to rupture the adhesive film together with the wafer. In the case where the chip size is small, undivided regions where the adhesive film is not ruptured along the chips may be generated even when the expandable tape is expanded using the expanding apparatus.

In addition, while there is also a method in which the adhesive film is ruptured by laser dicing, a long processing time is required where the chip size is small. In view of this, there has been proposed a processing method in which dicing before grinding (DBG), in which cut grooves are formed on the front surface side of a wafer and the back surface side is thinned by grinding to divide the wafer into individual chips, is performed, and thereafter a liquid die bonding agent is injected and applied to the back surface of the wafer and is cured to form an adhesive layer on each of the chips (see, for example, Japanese Patent Laid-open No. 2016-207936). According to this processing method, it is unnecessary to cut the adhesive layer by a laser beam or the like, and, therefore, the time required for forming the adhesive layer can be shortened.

SUMMARY OF THE INVENTION

However, in the processing method of Japanese Patent Laid-open No. 2016-207936, the front surface side (the pattern surface side where devices are formed) of the wafer is cut by the cutting blade, and, therefore, division lines having a width larger than the thickness of the cutting blade (cutting width) are needed. When the width of the division lines becomes larger, the number of chips obtainable per wafer is reduced, and productivity is lowered.

It is therefore an object of the present invention to provide a wafer processing method by which the number of chips obtainable per wafer can be increased.

In accordance with an aspect of the present invention, there is provided a method of processing a wafer that includes a substrate and a device layer formed with devices in respective regions partitioned by a plurality of division lines intersecting on a front surface of the substrate, the method including: a laser beam applying step of applying a laser beam of such a wavelength as to be transmitted through the wafer to the wafer along the division lines, with a focal point of the laser beam positioned in an inside of the substrate, to form modified layers along the division lines and to extend device layer splitting cracks from the modified layers to the front surface of the wafer; after the laser beam applying step is performed, a cutting step of cutting the wafer along the division lines by a cutting blade from a back surface of the wafer, to form cut grooves while leaving uncut portions inclusive of the device layer on the front surface side of the wafer and to remove the modified layers; after the cutting step is performed, a coating step of coating the back surface side of the wafer with a liquid die bonding agent, to form a liquid die-bonding layer on the back surface of the wafer without filling the cut grooves with the liquid die bonding agent; and after the coating step is performed, a curing step of curing the liquid die-bonding layer.

Preferably, the method of processing the wafer further includes, before the laser beam applying step is performed, a thinning step of grinding a back surface of the wafer to thin the wafer to a finished thickness.

According to the wafer processing method of the present invention, the device layer can be split into the device layers by cracks generated in the inside of the wafer, without forming the cut grooves on the front surface side of the wafer. As a result, it becomes unnecessary to set large the width of the division lines, so that the number of chips obtainable per wafer can be increased, and productivity of the chips is enhanced.

After the laser beam applying step is performed, the cutting step is performed to cut the wafer by the cutting blade from the back surface side, thereby forming the cut grooves and removing the modified layers. Therefore, the modified layers are not left on the chips, and the die strength of the chips is enhanced.

Preferably, the wafer processing method of the present invention further includes, before the laser beam applying step is performed, the thinning step of grinding the back surface of the wafer to thin the wafer to a finished thickness. As a result, cracks which reach the front surface of the wafer and by which the device layer can be split into the device layers can be extended by only forming the modified layers by applying the laser beam to the wafer, for example, one time (one pass), and the wafer can be divided in a favorable manner.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
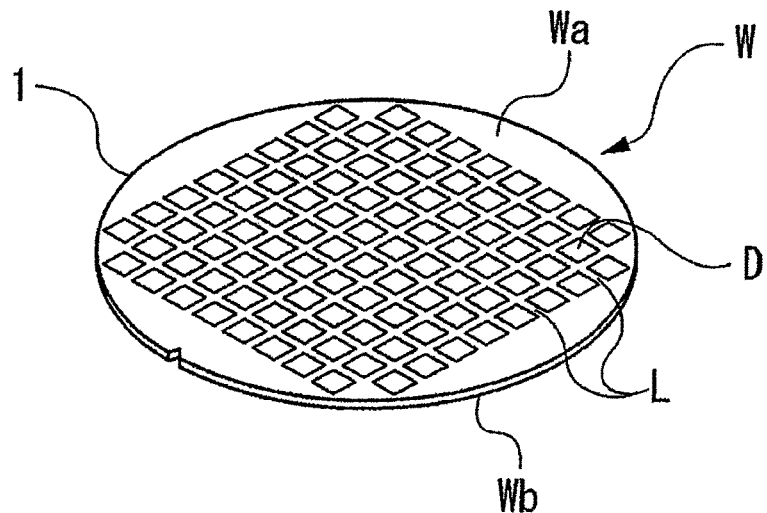
FIG. 1 is a perspective view showing the configuration of a wafer.

A wafer W shown in FIG. 1 is an example of a circular plate-shaped workpiece, and it includes a substrate 1, and a device layer formed with devices D such as large scale integrated circuits (LSIs) in respective regions partitioned by a plurality of division lines (streets) L intersecting on a front surface Wa of the substrate 1. A back surface Wb on a side opposite to the front surface Wa of the substrate 1 is a work surface to be subjected to grinding or the like. A wafer processing method for dividing the wafer W into individual chips will be described below.

(1) Thinning Step

Figure 2:
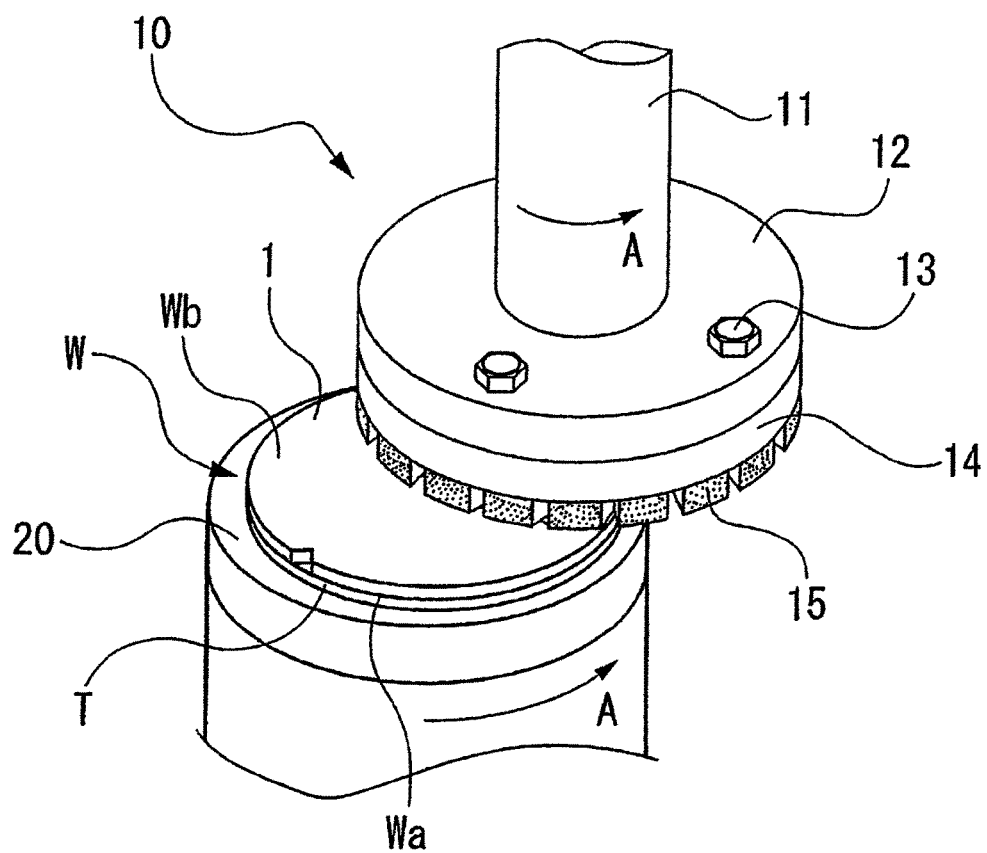
FIG. 2 is a perspective view showing a thinning step.

First, using a grinding unit 10 shown in FIG. 2, the back surface Wb of the wafer W is ground to thin the wafer W to a finished thickness. The grinding unit 10 includes a spindle 11 rotationally driven by a motor, a mount 12 fixed to a lower end of the spindle 11, a grinding wheel 14 detachably mounted to the mount 12 by a plurality of screws 13, and a plurality of grindstones 15 firmly attached, in an annular pattern, to a lower portion of the grinding wheel 14.

When grinding the wafer W, a surface protective tape T is adhered to the front surface Wa of the wafer W, after which the front surface Wa side is placed on, for example, a holding table 20, with the back surface Wb exposed upwardly. After the wafer W is suction held onto the holding table 20 by a suction force supplied from a suction source (not shown), the holding table 20 is moved to a position under the grinding unit 10.

Figure 3:
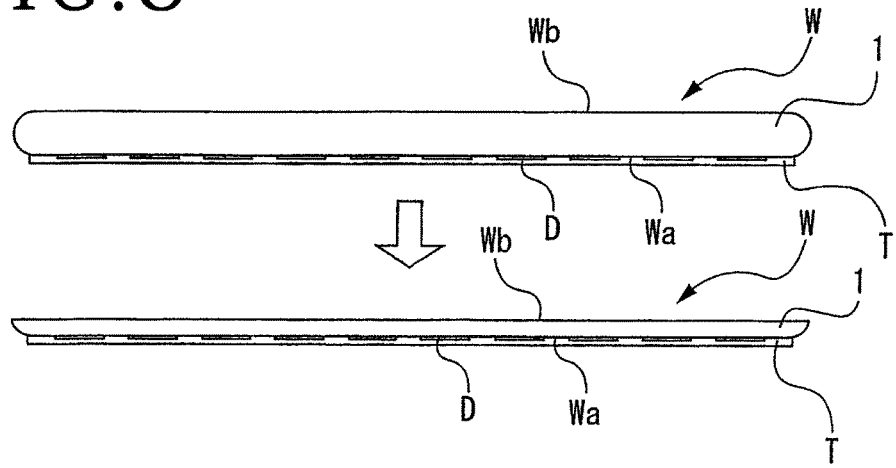
FIG. 3 is sectional views showing the wafer before thinned and the wafer after thinned.

Next, while the holding table 20 is being rotated, for example, in the direction of arrow A, the spindle 11 is rotated to rotate the grinding wheel 14, for example, in the direction of arrow A, and, while keeping the rotations, the grinding wheel 14 is put into grinding feeding at a predetermined grinding feed rate in a direction for approaching the wafer W held by the holding table 20. Then, the back surface Wb of the wafer W is ground by pressing it with the grindstones 15 lowered while rotating, whereby the wafer W in the state before thinning as shown on the upper side in FIG. 3 is thinned to a finished thickness of the wafer W shown on the lower side of the figure. The thickness of the wafer before thinned is set to a few hundreds of micrometers. The finished thickness of the wafer W is set to, for example, 50 to 80 μm. The thinning step is performed before a laser beam applying step which will be described later is performed.

(2) Laser Beam Applying Step

Figure 4:
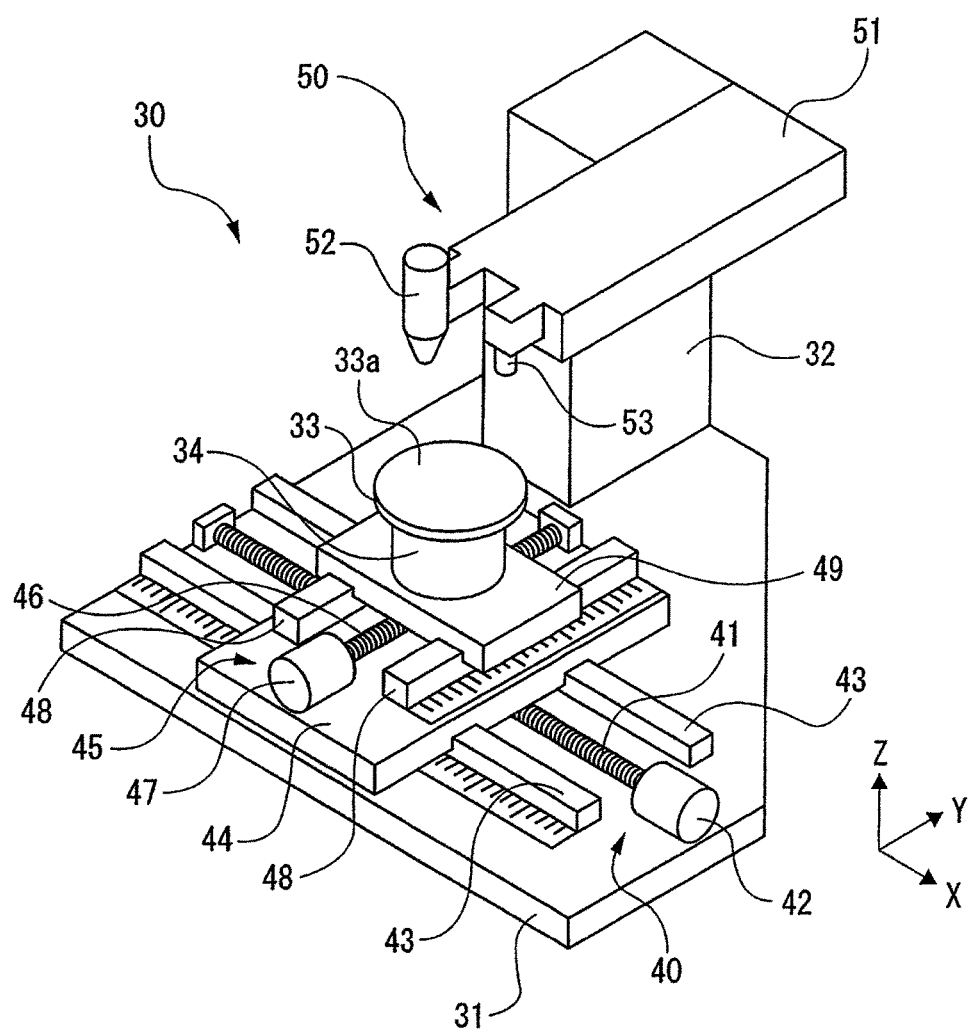
FIG. 4 is perspective view showing an example of a laser processing apparatus.

A laser processing apparatus 30 shown in FIG. 4 is used for performing the laser beam applying step. The laser processing apparatus 30 has a base 31 and includes, on the base 31, a holding table 33 having a holding surface 33a for holding the wafer W, a processing feeding unit 40 for processing feeding of the holding table 33 in a processing feed direction (X-axis direction), and an indexing feeding unit 45 for indexing feeding of the holding table 33 in an indexing feed direction (Y-axis direction). A rotation unit 34 for rotating the holding table 33 by a predetermined angle is connected to a lower side of the holding table 33.

The processing feeding unit 40 includes a ball screw 41 extending in the X-axis direction, a motor 42 connected to one end of the ball screw 41, a pair of guide rails 43 which are laid on the base 31 and extend in parallel to the ball screw 41, and an X-axis base 44 movable in the X-axis direction. The holding table 33 is supported on a surface on one side of the X-axis base 44 through the indexing feeding unit 45, the pair of guide rails 43 is in sliding contact with a surface on the other side of the X-axis base 44, and a ball screw 41 is in screw engagement with a nut formed at a central portion of the X-axis base 44. When the ball screw 41 driven by the motor 42 is rotated, the X-axis base 44 is thereby moved in the X-axis direction along the guide rails 43, whereby the holding table 33 can be put into processing feeding in the X-axis direction.

The indexing feeding unit 45 includes a ball screw 46 extending in the Y-axis direction, a motor 47 connected to one end of the ball screw 46, a pair of guide rails 48 which are laid on the X-axis base 44 and extend in parallel to the ball screw 46, and a Y-axis base 49 movable in the Y-axis direction. The holding table 33 is supported on one side surface of the Y-axis base 49, the pair of guide rails 48 are in sliding contact with the other surface of the Y-axis base 49, and the ball screw 46 is in screw engagement with a nut formed at a central portion of the Y-axis base 49. When the ball screw 46 driven by the motor 47 is rotated, the Y-axis base 49 is thereby moved in the Y-axis direction along the guide rails 48, whereby the holding table 33 can be put into indexing feeding in the Y-axis direction.

At a rear portion in the Y-axis direction of the base 31, there is erectly provided a column 32 extending in the Z-axis direction. The column 32 is provided with a laser beam applying unit 50. The laser beam applying unit 50 includes a casing 51 that is fixed to the column 32 and extends to an upper side of a moving path of the holding table 33, and a laser applying head 52 attached to a tip of the casing 51. A laser oscillator that oscillates a laser beam of such a wavelength as to be transmitted through the wafer W is accommodated in the casing 51. A focusing lens for focusing the laser beam oscillated from the laser oscillator is incorporated in the laser applying head 52. The laser beam applying unit 50 is provided with a focal point position adjustment unit (not shown) for adjusting the position of a focal point of the laser beam which is focused by the focusing lens.

At a position located at the tip of the casing 51 and adjacent to the laser applying head 52, there is disposed an imaging unit 53 which images, from above, the wafer W held on the holding table 33. The imaging unit 53 is, for example, an infrared camera incorporating a charge coupled device (CCD) image sensor.

In performing the laser beam applying step, the wafer W is suction held on the holding surface 33a of the holding table 33, with the front surface Wa side on the lower side, through the surface protective tape T. Subsequently, alignment is conducted by positioning the holding table 33 at a position directly under the imaging unit 53 by the processing feeding unit 40, imaging the wafer W from above by the imaging unit 53, and image processing such as pattern matching is conducted, whereby a region (division line L) where to apply the laser beam is detected.

Figure 5:
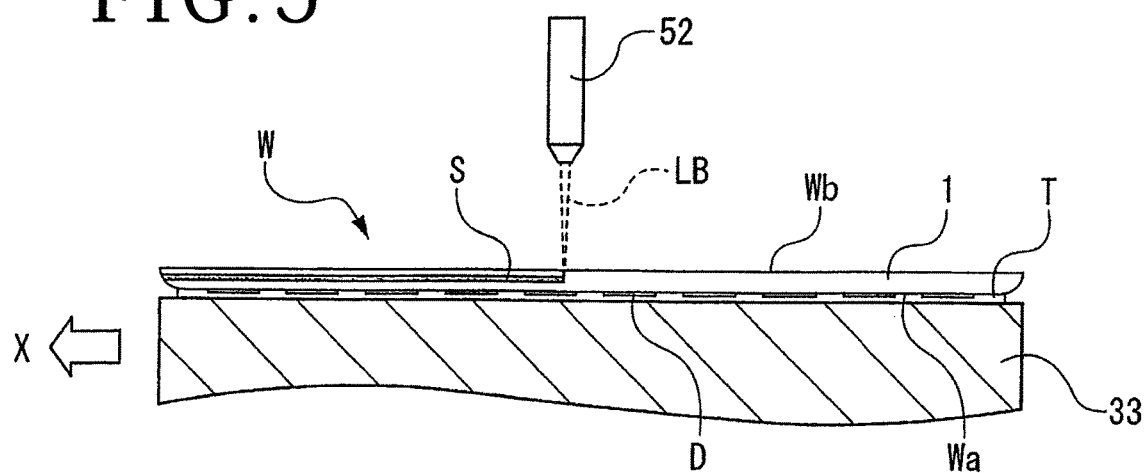
FIG. 5 is a sectional view showing a laser beam applying step.
Figure 6:
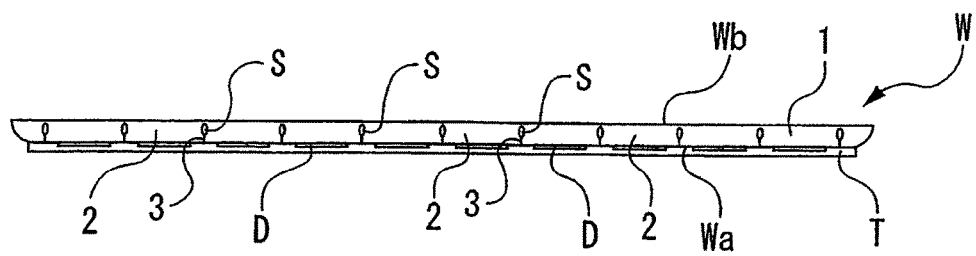
FIG. 6 is a sectional view showing the wafer after the laser beam applying step is performed.

Next, the laser applying head 52 is lowered in a direction for approaching the wafer W, then, as shown in FIG. 5, in a state in which the focal point of the laser beam LB of such a wavelength as to be transmitted through the wafer W is positioned in the inside of the substrate 1, the holding table 33 is put into processing feeding in the X-axis direction at a predetermined processing feed rate by the processing feeding unit 40 shown in FIG. 4, and, while performing the processing feeding, the laser beam LB is applied along the division lines L from the back surface Wb side of the wafer W by the laser applying head 52, to form modified layers S in the inside of the substrate 1 and to extend cracks 3 from the modified layers S to reach the front surface Wa as shown in FIG. 6. The modified layers S are regions in which the strength and physical characteristics are changed in the inside of the substrate 1. The cracks 3 are cracks extending in the thickness direction of the wafer W from end portions of the modified layers S. The position at which the modified layer S is to be formed in the inside of the substrate 1 is not particularly limited, but, preferably, it is such a position that the crack 3 can grow at least to reach the front surface Wa and is such a height position that the modified layer S is removed in the subsequent cutting step.

Each time the laser beam LB is applied along one division line L to form the modified layer S, the holding table 33 is put into indexing feeding by the indexing feeding unit 45 shown in FIG. 4, and the laser beam LB is applied along the next division line L. When application of the laser beam LB along all the division lines L directed in a first direction is completed, the holding table 33 is rotated 90 degrees, whereby the division lines L extending in a second direction orthogonal to the first direction are aligned with the X-axis direction. Then, the same laser processing operation as above is repeated along all the division lines L, to form the modified layers S along the division lines L, whereby the wafer W is split into a plurality of device layers 2, with the cracks 3 as splitting starting points.

(3) Cutting Step

Figure 7:
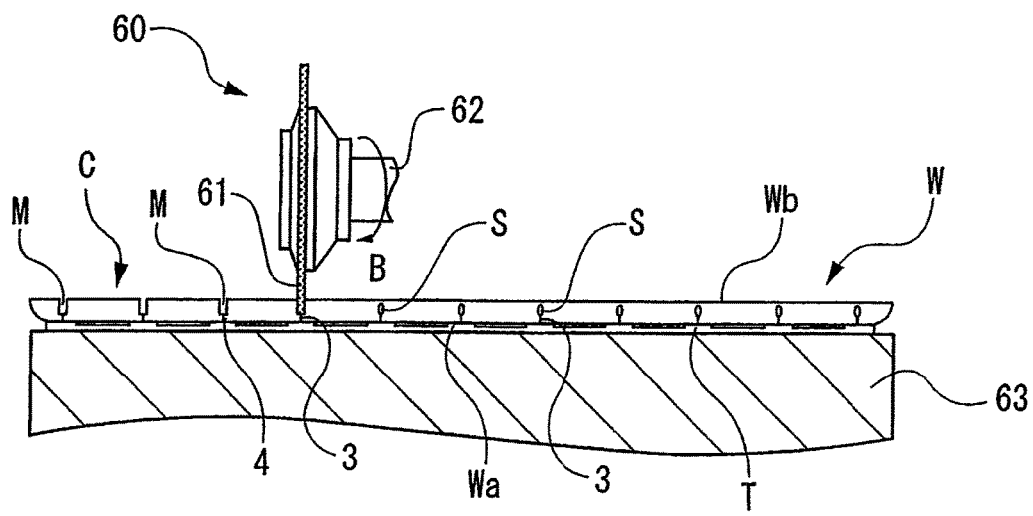
FIG. 7 is a sectional view showing a cutting step.

After the laser beam applying step is performed, the wafer W is cut from the back surface Wb along the division lines L by a cutting blade 61, using a cutting unit 60 shown in FIG. 7. The cutting unit 60 includes the cutting blade 61 for cutting the wafer W, and a spindle 62 which is equipped at its tip portion with the cutting blade 61 and which is rotated about a horizontal axis. Further, with the spindle 62 rotated, the cutting blade 61 is also rotated.

Figure 8:
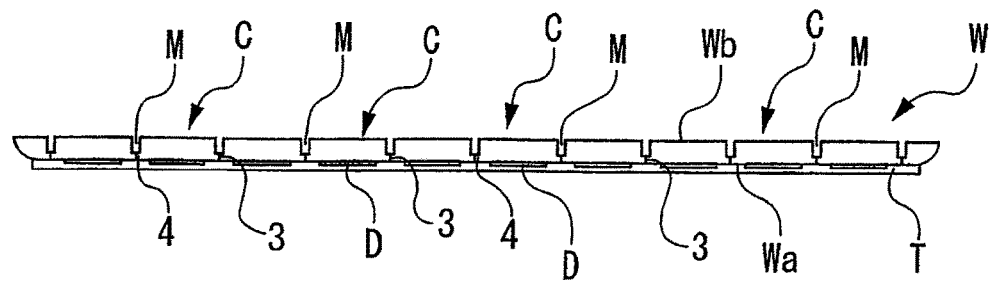
FIG. 8 is a sectional view showing the wafer after the cutting step is performed.

When performing the cutting step, for example, the front surface Wa side of the wafer W is placed on the holding table 63, with the back surface Wb exposed to the upper side. The wafer W is suction held on the holding table 63 by a suction force supplied from a suction source (not shown). Then, while the holding table 63 is being moved in a horizontal direction at a predetermined processing feed rate, the spindle 62 of the cutting unit 60 is rotated to thereby rotate the cutting blade 61 at a predetermined rotational speed in, for example, the direction of arrow B, and, while keeping the rotation, the wafer W is cut from the back surface Wb along the division line L, to form a cut groove M while leaving an uncut portion 4 inclusive of a device layer 2 on the front surface Wa side of the wafer W and to remove the modified layer S. The cut grooves M are formed and the modified layers S are removed along all the division lines L, whereby the wafer W is divided into individual chips C which are high in die strength, as shown in FIG. 8.

(4) Coating Step

Figure 9:
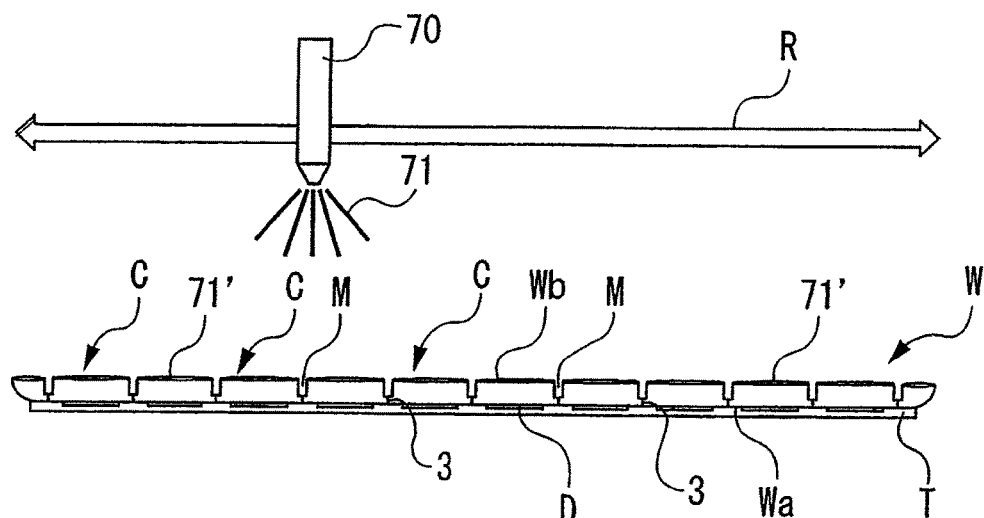
FIG. 9 is a sectional view showing a coating step.

After the cutting step is performed, the back surface Wb side of the wafer W is coated with a liquid die bonding agent 71 by use of, for example, a spray nozzle 70, as shown in FIG. 9. The spray nozzle 70 is formed at a lower portion thereof with a jet port for jetting the liquid die bonding agent 71 downward. The spray nozzle 70 is connected to a supply source (not shown) of the liquid die bonding agent 71, and can jet the liquid die bonding agent 71 downward. The liquid die bonding agent 71 is composed, for example, of a polyimide resin, an epoxy resin, an acrylic resin or the like. As the liquid die bonding agent 71, an ultraviolet (UV)-curing resin which is cured by irradiation with UV rays or a thermosetting resin which is cured by heating is desirably used.

In the coating step, while moving the spray nozzle 70 horizontally, for example, in a direction of arrow R, the liquid die bonding agent 71 is applied toward the back surface Wb of the wafer W held on the holding table (not shown), to form a liquid die bonding layer 71' on the back surface Wb of the wafer W, without filling the cut grooves M with the liquid die bonding agent 71. By preliminary adjustment of the viscosity of the liquid die bonding agent 71, the quantity of the liquid die bonding agent 71 supplied, or the like, the liquid die bonding agent 71 can be prevented from filling the cut grooves M. Note that the back surface Wb of the wafer W may be coated with the liquid die bonding agent 71 while rotating the holding table, or the back surface Wb of the wafer W may be coated with the liquid die bonding agent 71 by moving only the spray nozzle 70 horizontally while keeping the holding table in a stopped state.

In addition, the coating with the liquid die bonding agent 71 is not limited to the case of coating by the above-mentioned spray coating, and may be performed, for example, by spin coating, screen printing or the like. In the case of coating the back surface Wb of the wafer W with the liquid die bonding agent 71 by spin coating, it may be recommendable to jet a predetermined quantity of the liquid die bonding agent 71 toward the back surface Wb of the wafer W while rotating the holding table at a low speed, thereby applying the liquid die bonding agent 71 to the whole area of the back surface Wb of the wafer W.

(5) Curing Step

Figure 10:
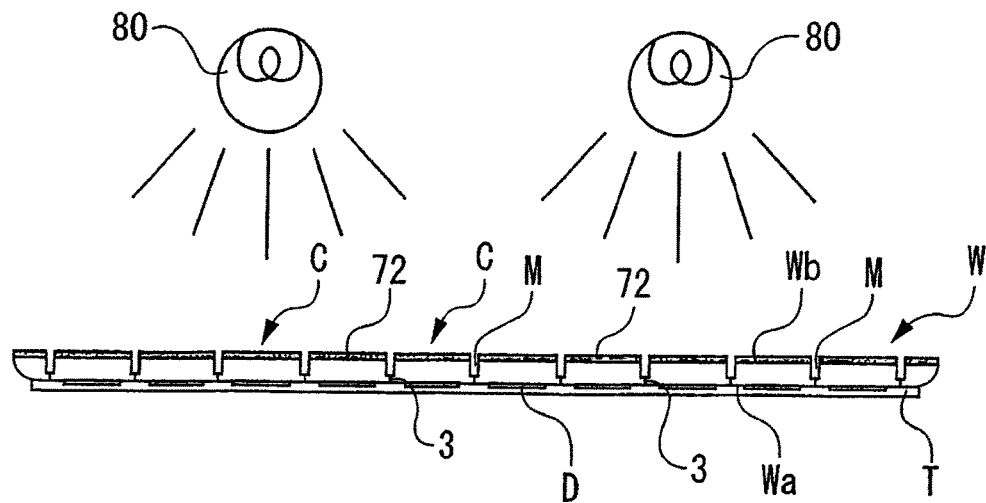
FIG. 10 is a sectional view showing a curing step.

After the coating step is performed, the liquid die bonding layer 71' applied to the back surface Wb of the wafer W is cured. In the case where the liquid die bonding agent 71 is a UV-curing resin, for example, as shown in FIG. 10, UV rays are applied toward the back surface Wb of the wafer W by a UV lamp 80 disposed on the upper side of the wafer W, to cure the liquid die bonding layer 71' by an external stimulus due to the UV rays, whereby the chips C each formed with a die bonding layer 72 on the back surface Wb are formed. In the case where the liquid die bonding agent 71 is a thermosetting resin, the liquid die bonding layer 71' is cured by heating, for example, by a heater or the like, whereby the chips C each formed with a die bonding layer 72 on the back surface Wb are formed.

(6) Transfer Step

Figure 11:
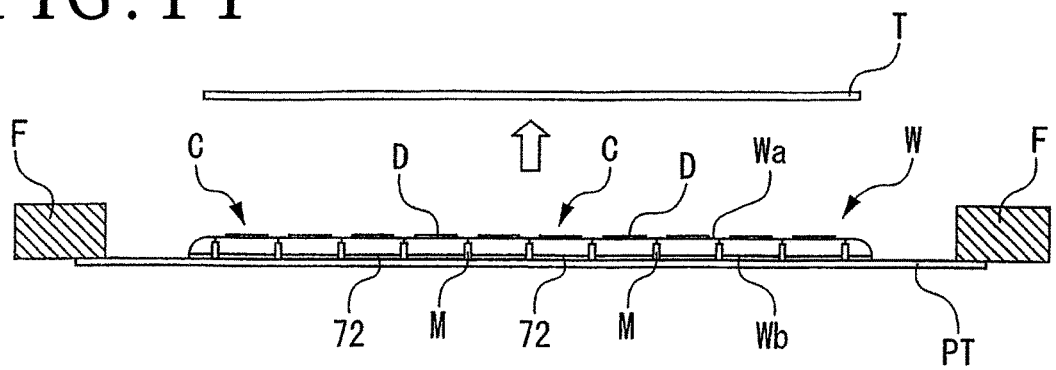
FIG. 11 is a sectional view showing a transfer step.

After the curing step is performed, as shown in FIG. 11, an expandable tape PT is adhered to a lower surface of an annular frame F opening in the center thereof, and the expandable tape PT is exposed through the center of the frame F. Next, the die bonding layer 72 side formed on the back surface Wb of the wafer W is adhered to the expandable tape PT exposed through the center of the frame F. In addition, the surface protective tape T is peeled off the front surface Wa of the wafer W, and the front surface Wa is directed to the upper side. The expandable tape PT may be any one that is expandable; for example, an expandable tape of a two-layer structure having an adhesive layer stacked on a substrate layer formed of polyolefin or polyvinyl chloride or the like is used.

(7) Chip Interval Forming Step

Figure 12:
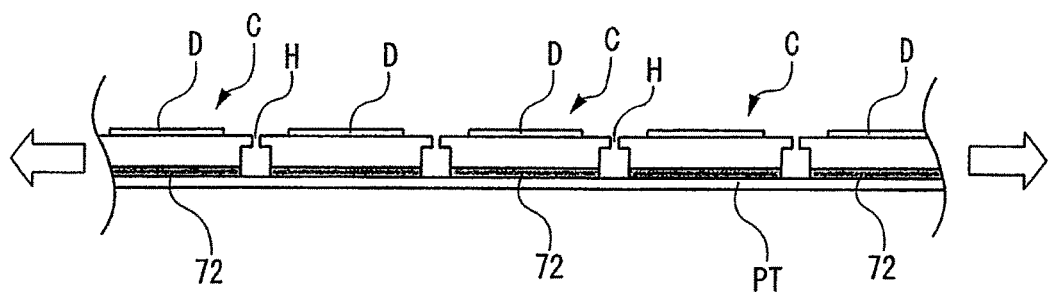
FIG. 12 is a sectional view showing a chip interval forming step.

Next, as shown in FIG. 12, the expandable tape PT is expanded in radial directions, to enlarge the intervals between the chips C. With the expandable tape PT expanded in a predetermined expansion amount, the intervals between the chips C are enlarged to form gaps H between the chips C, so that the chips C can be easily picked up. In the chip interval forming step, though not shown, it is recommendable to use, for example, an expanding apparatus for expanding in the radial directions the wafer W supported by the frame F through the expandable tape PT.

(8) Pick-Up Step

Figure 13:
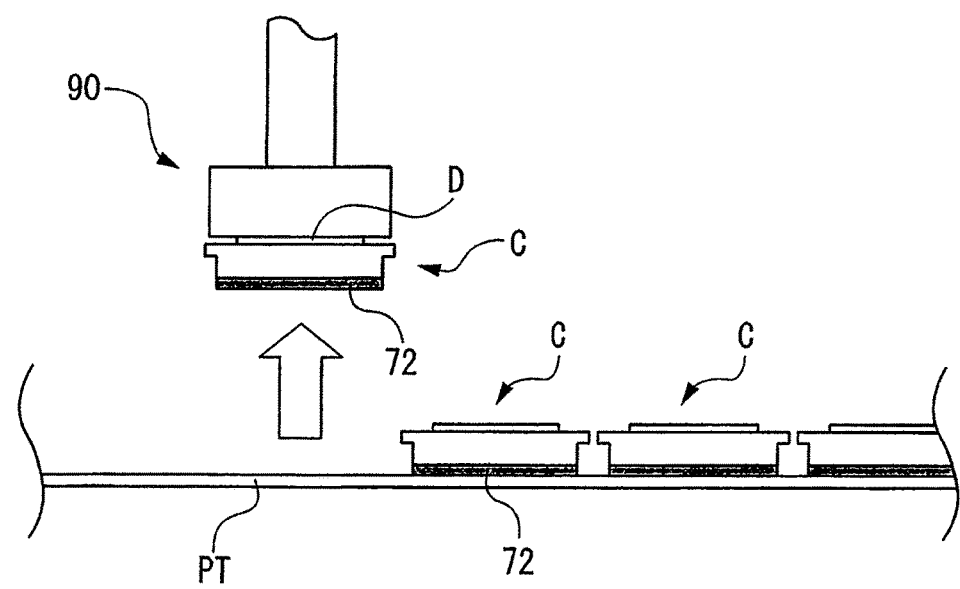
FIG. 13 is a sectional view showing a pick-up step.

As shown in FIG. 13, the chips C are each picked up. In picking up the chip C, for example, a pick-up unit 90 having a suction section for sucking the chip C is used. When the pick-up unit 90 sucks the chip C and is raised, the chip C is peeled off the expandable tape PT. Then, the chip C is transferred to the subsequent step (for example, a mounting step), and is mounted onto a mounting substrate.

As has been described above, in the wafer processing method according to the present invention, the laser beam applying step is performed to form the modified layers S in the inside of the wafer W along the division lines L and to extend the cracks 3, for splitting the device layer 2, from the modified layers S to the front surface Wa of the wafer W; therefore, the device layer 2 can be split into the device layers 2 by the cracks 3 generated in the inside of the wafer W, without forming cut grooves on the front surface Wa side of the wafer W. As a result, it becomes unnecessary to set large the width of the division lines L (streets), so that the number of chips C obtainable per wafer is increased, and the productivity of the chips C is enhanced.

After the laser beam applying step is performed, the wafer W is cut from the back surface Wb side by the cutting blade 61 to form the cut grooves M and remove the modified layers S; therefore, the modified layers S are not left on the chips C, so that the chips C are enhanced in die strength.

In addition, in the wafer processing method according to the present invention, the thinning step of grinding the back surface Wb of the wafer W to thin the wafer W to a finished thickness is performed before performing the laser beam applying step; therefore, in the laser beam applying step, it is unnecessary to apply the laser beam LB to the wafer W divisionally in a plurality of passes. In other words, cracks 3 which reach the front surface Wa of the wafer W and by which the device layer 2 can be split can be extended by only forming the modified layers S by applying the laser beam LB to the wafer W, for example, one time (one pass), and, accordingly, the wafer W can be divided in a favorable manner.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer that includes a substrate and a device layer formed with devices in respective regions partitioned by a plurality of division lines intersecting on a front surface of the substrate, the method comprising:

a laser beam applying step of applying a laser beam of such a wavelength as to be transmitted through the wafer to the wafer along the division lines, with a focal point of the laser beam positioned in an inside of the substrate, to form modified layers along the division lines and to extend device layer splitting cracks from the modified layers to the front surface of the wafer;

after the laser beam applying step is performed, a cutting step of cutting the wafer along the division lines by a cutting blade from a back surface of the wafer, to form cut grooves while leaving uncut portions inclusive of the device layer on the front surface side of the wafer and to remove the modified layers;

after the cutting step is performed, a coating step of coating the back surface side of the wafer with a liquid die bonding agent, to form a liquid die-bonding layer on the back surface of the wafer without filling the cut grooves with the liquid die bonding agent; and after the coating step is performed, a curing step of curing the liquid die-bonding layer.

2. The method of processing the wafer according to claim 1, further comprising, before the laser beam applying step is performed, a thinning step of grinding the back surface of the wafer to thin the wafer to a finished thickness.

* * * * *